United States Patent
Chen et al.

(10) Patent No.: US 12,296,428 B2
(45) Date of Patent: May 13, 2025

(54) CHEMICAL MECHANICAL POLISHING APPARATUS AND METHOD

(71) Applicant: TAIWAN SEMICONDUCTOR MANUFACTURING CO., LTD., Hsinchu (TW)

(72) Inventors: Yen-Liang Chen, Taichung (TW); Jun-Xiu Liu, Taichung (TW); Chia-Hsien Chou, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1533 days.

(21) Appl. No.: 16/657,161

(22) Filed: Oct. 18, 2019

(65) Prior Publication Data
US 2020/0130134 A1   Apr. 30, 2020

Related U.S. Application Data

(60) Provisional application No. 62/751,725, filed on Oct. 29, 2018.

(51) Int. Cl.
*B24B 37/32* (2012.01)
*B24B 49/12* (2006.01)
*H01L 21/321* (2006.01)

(52) U.S. Cl.
CPC .............. *B24B 37/32* (2013.01); *B24B 49/12* (2013.01); *H01L 21/3212* (2013.01)

(58) Field of Classification Search
CPC ..... B24B 49/12; B24B 49/183; B24B 37/005; B24B 37/32; B24B 37/042; B24B 37/10;
(Continued)

(56) References Cited

U.S. PATENT DOCUMENTS 5,584,751 A * 12/1996 Kobayashi .............. B24B 37/30
                                                           451/287
6,280,306 B1 * 8/2001 Hosoki ................... B24B 37/30
                                                           451/288
(Continued)

FOREIGN PATENT DOCUMENTS

CN         100481340 C      4/2009
CN         104044057 A      9/2014
(Continued)

OTHER PUBLICATIONS

Kim, KR-20130102699-A machine translation, Sep. 23, 2013 (Year: 2013).*

*Primary Examiner* — Brian D Keller
*Assistant Examiner* — Marcel T Dion
(74) *Attorney, Agent, or Firm* — Maschoff Brennan

(57) ABSTRACT

A polish head of a chemical mechanical polishing system is provided. The polish head includes a carrier head, a membrane mounted to the carrier head, an inner retaining ring mounted to the carrier head and surrounding the membrane, an outer retaining ring mounted to the carrier head and surrounding the inner retaining ring, and an image capturing device. The outer retaining ring is spaced apart from the inner retaining ring. The image capturing device is mounted to the carrier head and between the inner retaining ring and the outer retaining ring.

20 Claims, 7 Drawing Sheets

(58) Field of Classification Search
CPC ... B24B 37/102; B24B 37/105; B24B 37/107; B24B 37/34; B24B 7/228; H01L 21/3212
USPC ............... 451/6, 286, 444, 21, 287, 288
See application file for complete search history.

(56) References Cited

U.S. PATENT DOCUMENTS

| | | | | |
|---|---|---|---|---|
| 6,923,709 | B2* | 8/2005 | Chen | B24B 37/32 451/6 |
| 2001/0023167 | A1* | 9/2001 | Kimura | B24B 49/12 451/6 |
| 2002/0071128 | A1* | 6/2002 | Doan | H01L 22/26 356/630 |
| 2003/0027498 | A1* | 2/2003 | Tseng | B24B 49/10 451/41 |
| 2005/0130562 | A1* | 6/2005 | Nabeya | B24B 49/12 451/6 |
| 2005/0142991 | A1 | 6/2005 | Nakao et al. | |
| 2006/0258269 | A1* | 11/2006 | Kim | B24B 37/30 451/41 |
| 2009/0111362 | A1* | 4/2009 | Nabeya | B24B 37/32 451/64 |
| 2012/0021671 | A1* | 1/2012 | McReynolds | B24B 37/042 451/6 |
| 2012/0214383 | A1 | 8/2012 | Tsai et al. | |
| 2013/0102152 | A1 | 4/2013 | Chao et al. | |
| 2013/0196573 | A1* | 8/2013 | Fukushima | B24B 37/04 451/36 |
| 2013/0196577 | A1* | 8/2013 | Chen | B24B 37/34 451/398 |
| 2015/0273650 | A1* | 10/2015 | Namiki | B24B 37/015 451/5 |
| 2016/0368115 | A1* | 12/2016 | Yasuda | B24B 47/12 |
| 2017/0291274 | A1* | 10/2017 | Shinozaki | B24B 37/30 |
| 2018/0071889 | A1* | 3/2018 | Huang | G08C 17/02 |
| 2018/0133863 | A1* | 5/2018 | Yavelberg | B24B 49/16 |
| 2019/0283209 | A1* | 9/2019 | Osterheld | B24B 49/186 |
| 2020/0078903 | A1* | 3/2020 | Ono | B24B 49/003 |

FOREIGN PATENT DOCUMENTS

| | | | | |
|---|---|---|---|---|
| KR | 20040056634 A | | 7/2004 | |
| KR | 20070087966 A | | 8/2007 | |
| KR | 20130102699 A | * | 9/2013 | ............ B24B 37/32 |
| TW | 201236105 A | | 9/2012 | |
| TW | 201540427 A | | 11/2015 | |
| TW | 201718175 A | | 6/2017 | |
| TW | 201834780 A | | 10/2018 | |

* cited by examiner

CHEMICAL MECHANICAL POLISHING APPARATUS AND METHOD

CROSS-REFERENCE TO RELATED APPLICATION

This application claims priority to U.S. Provisional Application Ser. No. 62/751,725, filed Oct. 29, 2018, which is herein incorporated by reference in its entirety.

BACKGROUND

Generally, semiconductor devices include active components, such as transistors, formed on a substrate. Any number of interconnect layers may be formed over the substrate connecting the active components to each other and to outside devices. The interconnect layers are made of low-k dielectric materials including metallic trenches/vias.

As the layers of a device are formed, it is sometimes desirable to planarize the device. For example, the formation of metallic features in the substrate or in a metal layer may cause uneven topography. This uneven topography creates difficulties in the formation of subsequent layers. For example, uneven topography may interfere with the photolithographic process used to form various features in a device. It is, therefore, desirable to planarize the surface of the device after various features or layers are formed. One method of planarization is chemical mechanical polishing (CMP).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
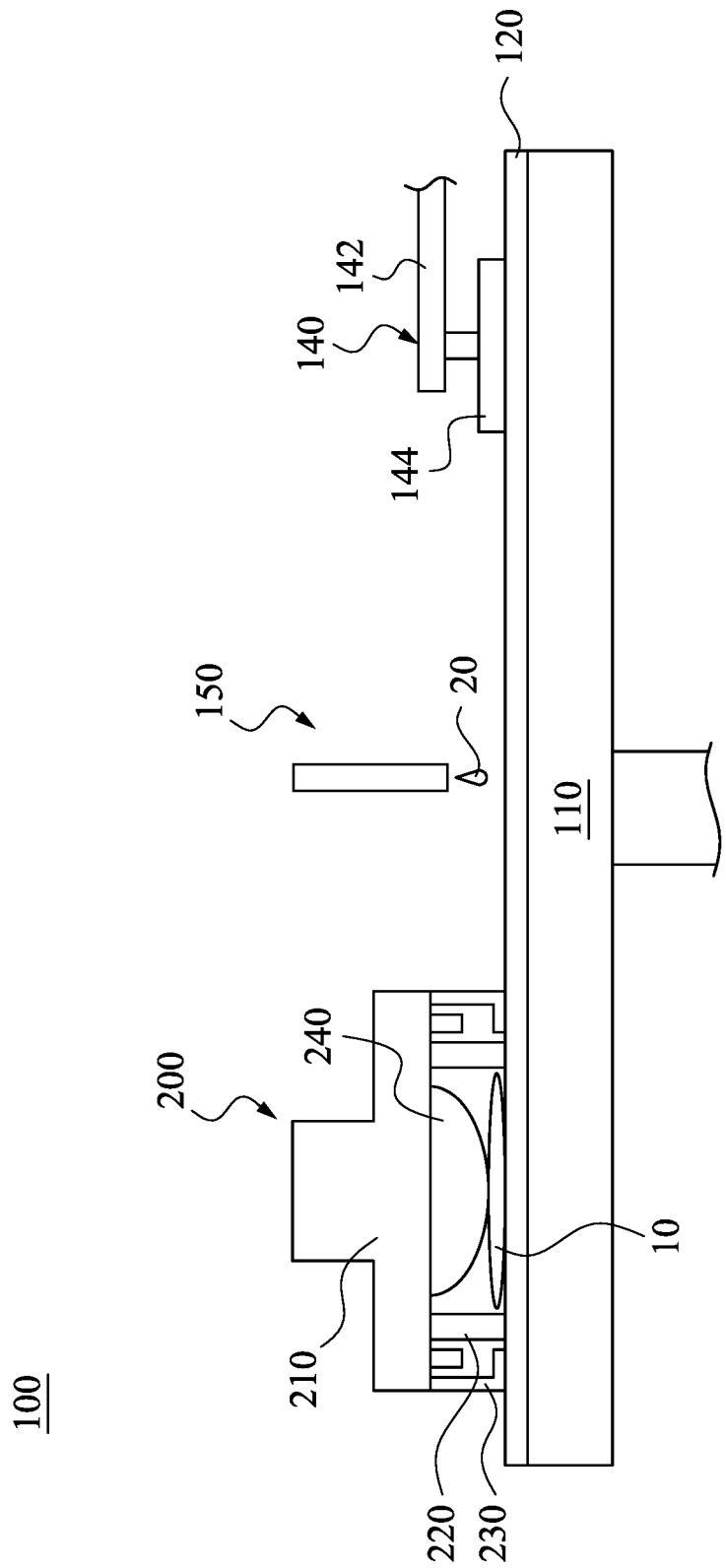
FIG. 1 is a schematic view of a chemical mechanical polishing (CMP) system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
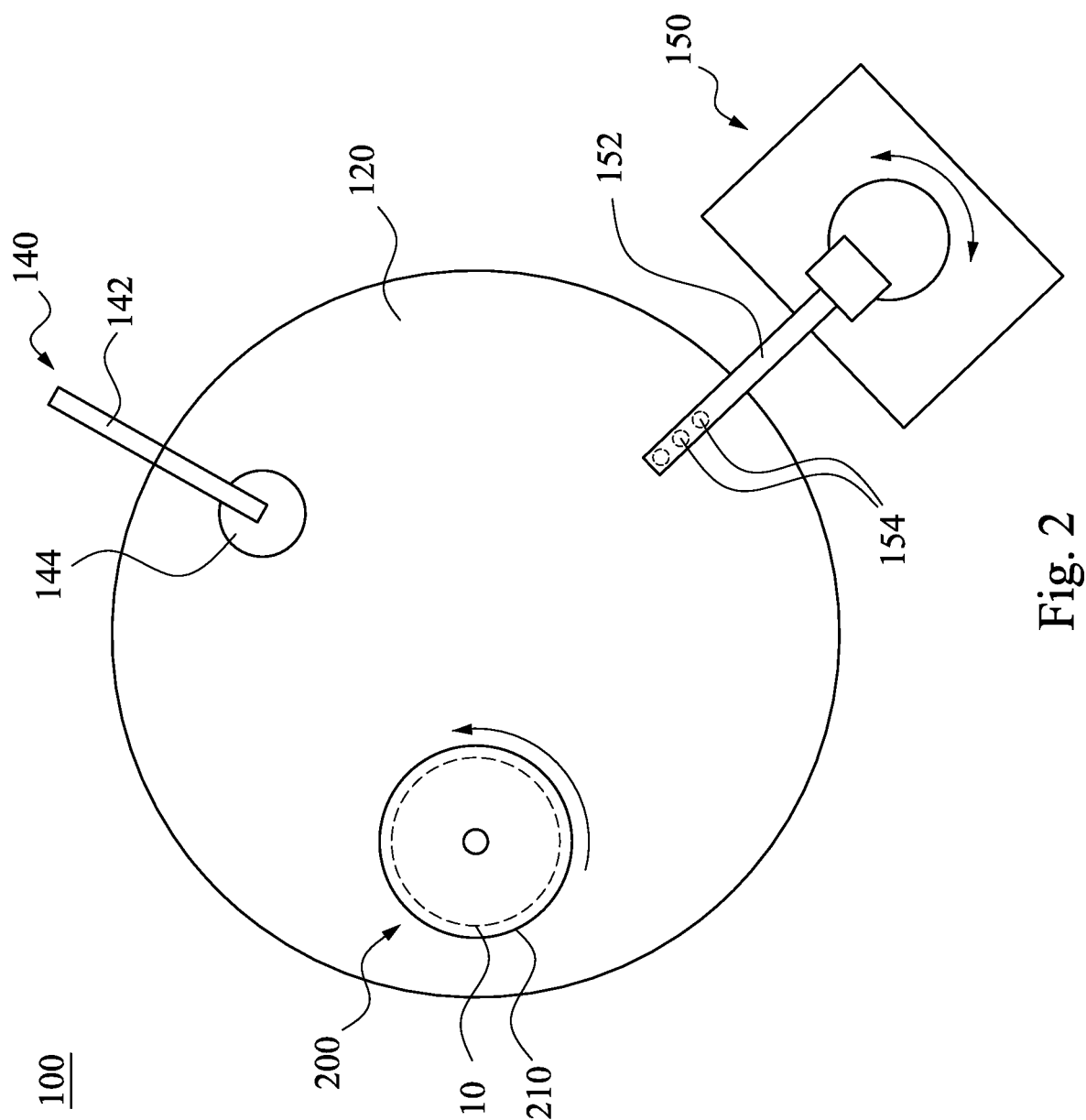
FIG. 2 is a top view of the CMP system of FIG. 1.

FIG. 1 is a schematic view of a chemical mechanical polishing (CMP) system 100 according to some embodiments of the present disclosure. FIG. 2 is a top view of the CMP system 100 of FIG. 1. The CMP system 100 is configured to perform a planarization process on a wafer 10 in a semiconductor manufacturing process. The CMP system 100 includes a platen 110, a polish pad 120, a polish head 200, a conditioner 140, and a slurry dispenser 150 in accordance with some embodiments of the present disclosure. The platen 110 is driven by a motor to rotate the polish pad 120 about a rotation axis. In some embodiments, the platen 110 is circular, in a top view. The diameter of the platen 110 is larger than the diameter of the wafer 10 to be polished.

The polish pad 120 is disposed on the platen 110. The polish pad 120 may be a consumable item. The polish pad 120 may be a hard and incompressible pad or a soft pad. For oxide polishing, hard and stiffer pads may be used to achieve planar surfaces. Softer pads may be used in other polishing processes to achieve uniform and smooth surfaces. The hard pads and the soft pads may also be combined in an arrangement of stacked pads for customized applications.

The polish head 200 is configured to house the wafer 10. In some embodiments, the polish head 200 includes a carrier head 210, a membrane 240, and at least one retaining ring. In some embodiments, the retaining ring includes an outer retaining ring 230 and an inner retaining ring 220. The inner retaining ring 220 is disposed between the outer retaining ring 230 and the membrane 240. The outer retaining ring 230 and the inner retaining ring 220 can adjust a surface profile of the polish pad 120 and control the wafer edge profile.

The carrier head 210 picks up the wafer 10 from a stage, e.g., using vacuum suction on the membrane 240. The carrier head 210 carries the wafer 10 to the polish pad 120, and the carrier head 210 is lowered towards the polish pad 120 to polish the wafer 10. The membrane 240 under the carrier head 210 is pressurized to push the wafer 10 towards the polish pad 120. The wafer 10 is polished by rotating the polish pad 120 (and/or the carrier head 210). The wafer 10 may have various device elements thereon. Examples of device elements that are formed on the wafer 10 include transistors (e.g., metal oxide semiconductor field effect transistors (MOSFETs), complementary metal oxide semiconductor (CMOS) transistors, bipolar junction transistors (BJTs), high voltage transistors, high-frequency transistors, p-channel and/or n-channel field-effect transistors (PFETs/NFETs), etc.), diodes, and/or other suitable elements. Various processes may be performed to form the device elements, such as deposition, etching, implantation, photolithography, annealing, and/or other suitable processes. In some embodiments, shallow trench isolation (STI)

structures, inter-layer dielectric (ILD) layers, and/or inter-metal dielectric layers may also be formed in or on the wafer 10.

The conditioner 140 is configured to condition the polish pad 120. In some embodiments, the conditioner 140 includes a conditioning arm 142 and a conditioning pad 144. The conditioning arm 142 holds the conditioning pad 144 which is in contact with the polish pad 120 during the planarization process. The conditioning arm 142 moves the conditioning pad 144 in a sweeping motion across a region of the polish pad 120. The conditioning pad 144 includes a substrate over which an array of abrasive particles, such as diamonds, is bonded using, for example, electroplating. The conditioning pad 144 removes built-up wafer debris and excess slurry from the polish pad 120. The conditioning pad 144 also acts as an abrasive for the polish pad 120 to create an appropriate texture against which the wafer 10 may be properly planarized.

The slurry dispenser 150 includes a dispenser arm 152 and a number of nozzles 154. The nozzles 154 are arranged on a bottom surface of the dispenser arm 152 and are configured to supply slurry 20 over the polish pad 120. The composition of the slurry 20 supplied by the slurry dispenser 150 depends on the type of material on the wafer surface undergoing the CMP. For example, tungsten slurries may be acidic to enhance the chemical etching effect on tungsten films, while copper slurries may be basic to minimize corrosion of copper films.

In some embodiments, one or more elements can be added to or omitted from the CMP system 100. For example, an atomizer nozzle can be added to the CMP system 100 and is configured to supply a high pressure rinse over the polish pad 120, thereby cleaning the polish pad 120.

Figure 3:
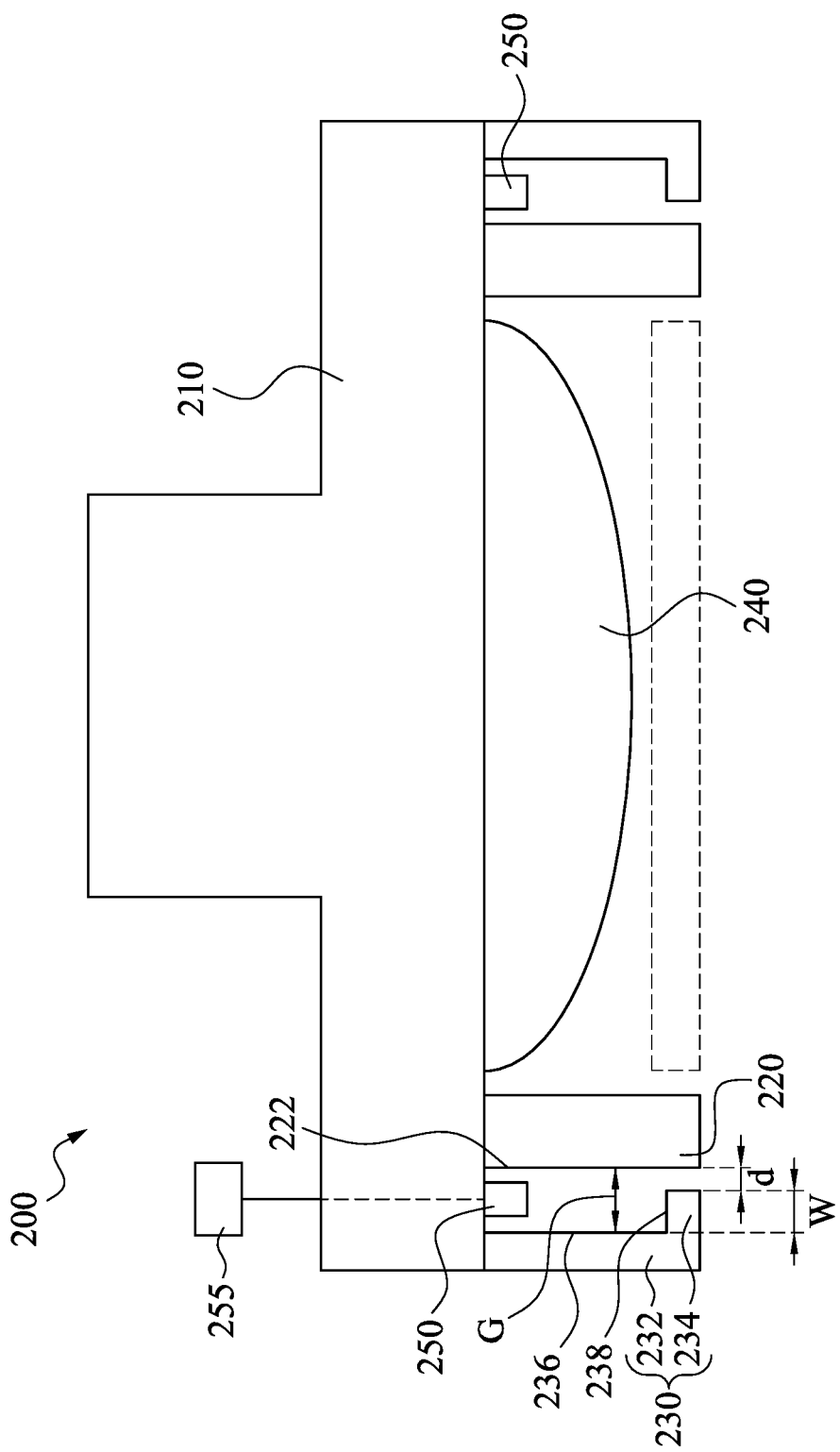
FIG. 3 is a cross-sectional view of the polish head of FIG. 1.
Figure 4:
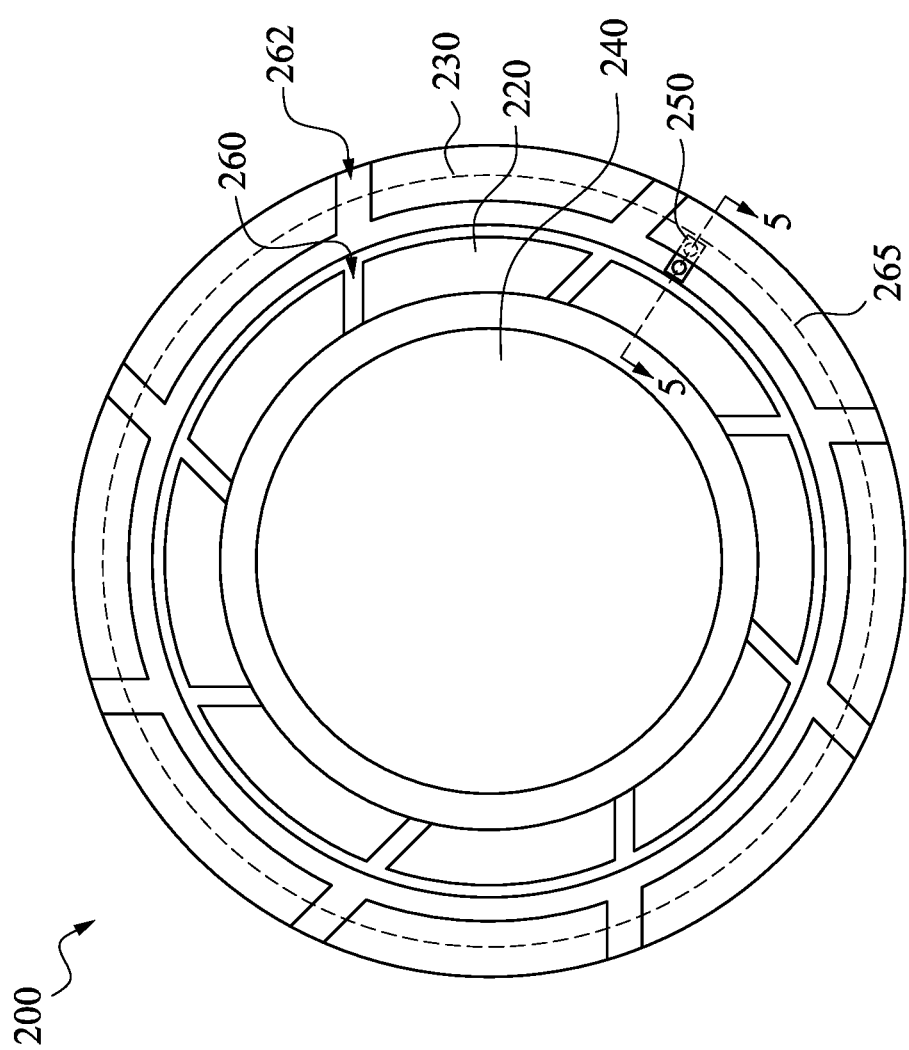
FIG. 4 is a bottom view of the polish head of FIG. 1.

Reference is now made to FIG. 3 and FIG. 4. FIG. 3 is a cross-sectional view of the polish head 200 of FIG. 1. FIG. 4 is a bottom view of the polish head 200 of FIG. 1. The polish head 200 includes a carrier head 210, an inner retaining ring 220, an outer retaining ring 230, a membrane 240, and an image capturing device 250. The carrier head 210 is configured to accommodate a wafer therein. The inner retaining ring 220 and outer retaining ring 230 are configured to retain the wafer in a horizontal position. The membrane 240 is configured to secure the wafer, and pressing the wafer in a downward direction.

The inner retaining ring 220 and the outer retaining ring 230 are concentrically arranged. The membrane 240 is mounted to the carrier head 210. The inner retaining ring 220 is mounted to the carrier head 210 and surrounds the membrane 240. The outer retaining ring 230 is mounted to the carrier head 210 and surrounds the inner retaining ring 220. The outer retaining ring 230 is spaced apart from the inner retaining ring 220. The outer retaining ring 230 is formed with a wall portion 232 and a ledge portion 234. The ledge portion 234 horizontally extends from the wall portion 232 toward the inner retaining ring 220, and a bottom surface of the ledge portion 234 is substantially coplanar with a bottom surface of the wall portion 232. During the CMP process, the ledge portion 234 of the outer retaining ring 230 may be in contact with the inner retaining ring 220 and is configured to retain the inner retaining ring 220 in a horizontal position by restricting the horizontal movement of the inner retaining ring 220. The inner retaining ring 220 in turn is configured to retain the wafer in a horizontal position by restricting the horizontal movement of the wafer. An inner sidewall 236 of the wall portion 232 of the outer retaining ring 230 that faces the inner retaining ring 220 and an outer sidewall 222 of the inner retaining ring 220 that faces the outer retaining ring 230 define a gap G therebetween.

In some embodiments, the inner retaining ring 220 includes polyurethane, polyester, polyether, polycarbonate, any combination thereof, or any other suitable material. In some embodiments, the outer retaining ring 230 includes polyether ether ketone (PEEK), polyphenylene sulfide (PPS), any combination thereof, or any other suitable material. In some embodiments, the inner retaining ring 220 is softer than the outer retaining ring 230 in hardness. In some embodiments, the inner retaining ring 220 has a hardness ranging from about 15 to about 105 in Shore A hardness scale and the outer retaining ring 230 has a hardness ranging from about 95 to about 110 in Rockwell M hardness scale. The softer inner retaining ring 220 absorbs impact/contact energy and reduces vibrations between the inner retaining ring and the wafer during the CMP process and prevents damage/peeling on the wafer.

The Shore hardness is a measure of the resistance of a material to penetration of a calibrated spring loaded needle-like indenter, measured by using a durometer. The hardness of polymers (rubbers, plastics) is measured by Shore scales. The Rockwell hardness is measured by indenting the test material with a diamond cone or hardened steel ball indenter. The indenter is forced into the test material under a preliminary minor load and the application and removal of an additional major load results in a permanent increase in the depth of penetration that is used to calculate the Rockwell hardness number.

In some embodiments, the inside diameter of the inner retaining ring 220 ranges from about 300 mm to about 303 mm, and the outside diameter of the outer retaining ring 230 ranges from about 329 mm to about 333 mm. In some other embodiments, the sizes of the inner retaining ring 220 and the outer retaining ring 230 can be different to accommodate a larger or smaller wafer during a CMP process or other processes requiring the wafer to be retained during a process step.

In some embodiments, the inner retaining ring 220 has a thickness ranging from about 31 mm to about 35 mm. In some embodiments, the outer retaining ring 230 has a thickness ranging from about 25 mm to about 28 mm. In some embodiments, the thickness of the inner retaining ring 220 is thicker than the thickness of the outer retaining ring 230, and the thickness difference thereof is in a range from about 6 mm to about 8 mm. If the thickness difference between the inner retaining ring 220 and the outer retaining ring 230 is greater than about 8 mm, the inner retaining ring 220 might be too thick, such that a contact area between the inner retaining ring 220 and the polish pad might be too large, and thus unwanted particles might be formed due to friction between the inner retaining ring 220 and the polish pad. If the thinness difference between the inner retaining ring 220 and the outer retaining ring is smaller than about 6 mm, the inner retaining ring 220 might be too thin to have satisfactory mechanical strength.

In some embodiments, the inner retaining ring 220 and the outer retaining ring 230 are both attached to the bottom surface of the carrier head 210 using an adhesive (glue) layer.

However, during the CMP process, the ledge portion 234 of the outer retaining ring 230 may get worn out due to friction between the ledge portion 234 of the outer retaining ring 230 and the inner retaining ring 220, and the wall portion 232 of the outer retaining ring 230 may undesirably contact the inner retaining ring 220. In this case, the contact between the wall portion 232 of the outer retaining ring 230 and the inner retaining ring 220 results in undesired friction between the wall portion 232 of the outer retaining ring 230 and the inner retaining ring 220. The undesired friction between the wall portion 232 of the outer retaining ring 230 and the inner retaining ring 220 may result in defects on the wafer. In some embodiments, the gap G between the inner sidewall 236 of the wall portion 232 of the outer retaining ring 230 and the outer sidewall 222 of the inner retaining ring 220 is in a range from about 1.37 mm to about 2.06 mm to prevent the wall portion 232 of the outer retaining ring 230 from undesirably contacting the inner retaining ring 220.

In some embodiments, the image capturing device 250 of the polish head 200 is mounted to the carrier head 210 and arranged inside the gap G between the outer retaining ring 230 and the inner retaining ring 220 and is configured to capture images of a top surface 238 of the ledge portion 234 of the outer retaining ring 230, the inner sidewall 236 of the wall portion 232 of the outer retaining ring 230, and the outer sidewall 222 of the inner retaining ring 220. For example, in some embodiments, at least a portion of the image capturing device 250 is directly above the ledge portion 234.

In some embodiments, the captured images are analyzed to determine whether a width W of the ledge portion 234 of the outer retaining ring 230 is less than a predetermined value. When the width W of the ledge portion 234 of the outer retaining ring 230 is determined to be less than the predetermined value, an alarm is reported. In some embodiments, preventive maintenance is performed to replace the outer retaining ring 230 when the alarm is reported.

In some embodiments, the width W of the ledge portion 234 of the outer retaining ring 230 is in a range from about 0.77 mm to about 1.26 mm to prevent the wall portion 232 of the outer retaining ring 230 from undesirably contacting the inner retaining ring 220. If the width W of the ledge portion 234 of the outer retaining ring 230 is less than about 0.77 mm, then the outer retaining ring 230 is determined to be worn out, and an alarm is reported. In some embodiments, preventive maintenance is performed to replace the outer retaining ring 230 when the alarm is reported.

In some embodiments, the captured images are analyzed to determine whether a distance d between a sidewall of the ledge portion 234 of the outer retaining ring 230 and the outer sidewall 222 of the inner retaining ring 220 is greater than a predetermined value. When the distance d between the sidewall of the ledge portion 234 of the outer retaining ring 230 and the outer sidewall 222 of the inner retaining ring 220 is determined to be greater than the predetermined value, an alarm is reported. In some embodiments, preventive maintenance is performed to replace the inner retaining ring 220 and/or the outer retaining ring 230 when the alarm is reported.

In some embodiments, the distance d between the sidewall of the ledge portion 234 of the outer retaining ring 230 and the outer sidewall 222 of the inner retaining ring 220 is in a range from about 0.6 mm to about 0.8 mm to prevent the wall portion 232 of the outer retaining ring 230 from undesirably contacting the inner retaining ring 220. If the distance d between the sidewall of the ledge portion 234 and the outer sidewall 222 of the inner retaining ring 220 is determined to be greater than 0.9 mm; and/or the ratio of the width W to the distance d is determined to be less than about 0.3, the inner retaining ring 220 and/or the outer retaining ring 230 are/is determined to be worn out, and an alarm is reported. In some embodiments, preventive maintenance is performed to replace the inner retaining ring 220 and/or the outer retaining ring 230 when the alarm is reported.

Other features that can be observed from the captured images include roughness of the inner sidewall 236 of the wall portion 232 of the outer retaining ring 230, roughness of the outer sidewall 222 of the inner retaining ring 220, a slant angle of the inner sidewall 236 of the wall portion 232 of the outer retaining ring 230, and a slant angle of the outer sidewall 222 of the inner retaining ring 220. If the roughness of the inner sidewall 236 of the wall portion 232 of the outer retaining ring 230, the roughness of the outer sidewall 222 of the inner retaining ring 220, the slant angle of the inner sidewall 236 of the wall portion 232 of the outer retaining ring 230, and/or the slant angle of the outer sidewall 222 of the inner retaining ring 220 are/is determined to be unacceptable, then the inner retaining ring 220 and/or the outer retaining ring 230 are/is determined to be worn out, and an alarm is reported. In some embodiments, preventive maintenance is performed to replace the inner retaining ring 220 and/or the outer retaining ring 230 when the alarm is reported.

Furthermore, the inner retaining ring 220 has indented slots 260 in a bottom surface of the inner retaining ring 220, and the outer retaining ring 230 has indented slots 262 in a bottom surface of the outer retaining ring 230. The indented slots 262 of the outer retaining ring 230 are respectively substantially aligned with the indented slots 260 of the inner retaining ring 220 to form continuous channels that allows slurry to flow towards the wafer during the CMP process. In some embodiments, the indented slots 262 of the outer retaining ring 230 may have a width greater than a width of the indented slots 260 of the inner retaining ring 220. However, as slurry flows through the channel, it passes through the gap G between the outer retaining ring 230 and the inner retaining ring 220, and may undesirably seep into the gap G, leaving behind a contaminant residue inside the gap G between the outer retaining ring 230 and the inner retaining ring 220. The contaminant residue inside the gap G between the outer retaining ring 230 and the inner retaining ring 220 may also result in defects on the wafer.

In some embodiments, the captured images are analyzed to determine whether the contaminant residue inside the gap G exceeds a predetermined threshold. An alarm is reported when the contaminant residue inside the gap G is determined to exceed the predetermined threshold. In some embodiments, a clean process is performed on the polish head 200 to remove the contaminant residue from the gap G when the alarm is reported.

In some embodiments, because a portion of the contaminant residue inside the gap G is deposited on the top surface 238 of the ledge portion 234 of the outer retaining ring 230, the captured images are analyzed to determine whether the contaminant residue on the top surface 238 of the ledge portion 234 of the outer retaining ring 230 exceeds a predetermined threshold. An alarm is reported when the contaminant residue on the top surface 238 of the ledge portion 234 of the outer retaining ring 230 is determined to exceed the predetermined threshold. In some embodiments, a clean process is performed on the polish head 200 to remove the contaminant residue from the gap G when the alarm is reported.

In some embodiments, the gap G is in fluid communication with the indented slot 260 of the inner retaining ring 220 and the indented slot 262 of the outer retaining ring 230 at a junction. The image capturing device 250 is configured such that the image capturing device 250 is able to capture an image of a portion of the gap G adjacent to the junction.

Figure 6:
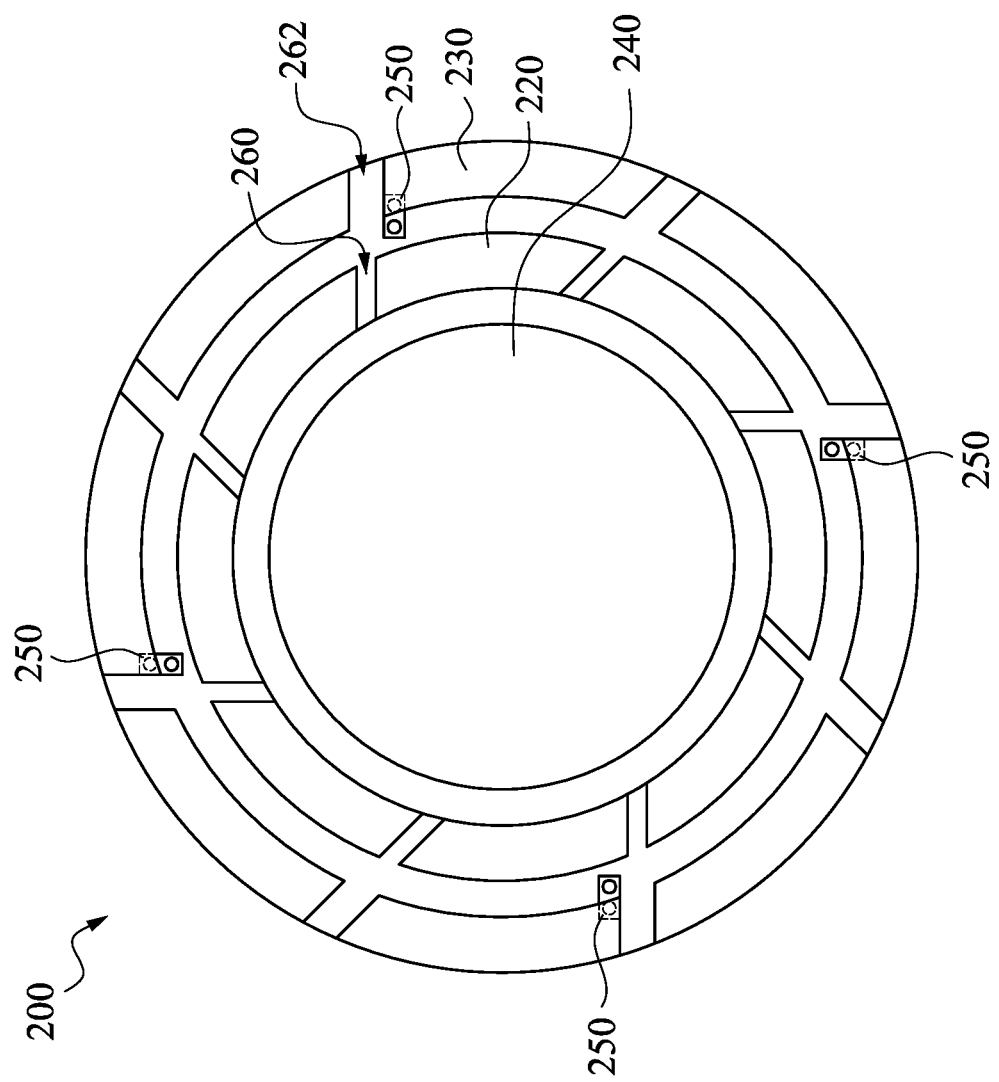
FIG. 6 is a bottom view of the polish head, according to some other embodiments of the present disclosure.

For example, in some embodiments, the image capturing device 250 is coupled to a rail 265 that allows the image capturing device 250 to move to a position immediately adjacent to the junction. In some other embodiments, the image capturing device 250 is disposed at a position immediately adjacent to the junction (as shown in FIG. 6).

In some embodiments, the image capturing device 250 is a large active area image sensor. For example, image capturing device 250 can be a photodiode, such as an indium gallium arsenide (InGaAs) photodiode. The InGaAs photodiode can detect images in conditions of low lighting, making it suitable for capturing images inside the gap G. The detected image is stored as a grayscale image with 16 bits per pixel sample or higher. In other words, each pixel in the stored image can be represented by 216 or 65,536 levels of light intensities or higher. The intensities at the corresponding pixels may not be spaced in linear proportion to the detected physical light. Instead, they may be spread out evenly on a gamma-compressed nonlinear scale to create a smoother image with no noticeably discontinuous pixels. The resulting stored image shows a clear contrast of details.

In some embodiments, the image capturing device 250 may use high dynamic range. A high dynamic range displays image features having clear boundaries and having a range of luminance similar to the range of luminance visible to the human eye. As such, the displayed image is easy for the human eye to interpret and identify features detected by the image capturing device 250.

In some embodiments, images captured by the image capturing device 250 are processed by a processor 255. The processor 255 is configured to process the captured images to calculate the level of wear on the outer retaining ring 230, such as the level of wear on the ledge portion 234 of the outer retaining ring 230. In some embodiments, the image capturing device 250 is configured to scan a target region, and the processor 255 is configured to calculate an area of the largest object in the target region. If the target region is in the gap G between the inner retaining ring 220 and the outer retaining ring 230, then the area of the largest object in the target region is an area of the top surface 238 of the ledge portion 234 of the outer retaining ring 230. However, if the ledge portion 234 of the outer retaining ring 230 is worn out, then the area of the top surface 238 of the ledge portion 234 is substantially reduced. As such, the area of the largest object in the target region is reduced. By calculating the area of the largest object in the target region, the processor can identify the level of wear on the ledge portion 234 of the outer retaining ring 230. In some embodiments, if the area of the largest object is greater than a predetermined value, then no alarm is reported by the processor; and if the area of the largest object is less than a predetermined value, then an alarm is reported. In some embodiments, preventive maintenance is performed to replace the outer retaining ring 230 with a new one when the alarm is reported.

Figure 5:
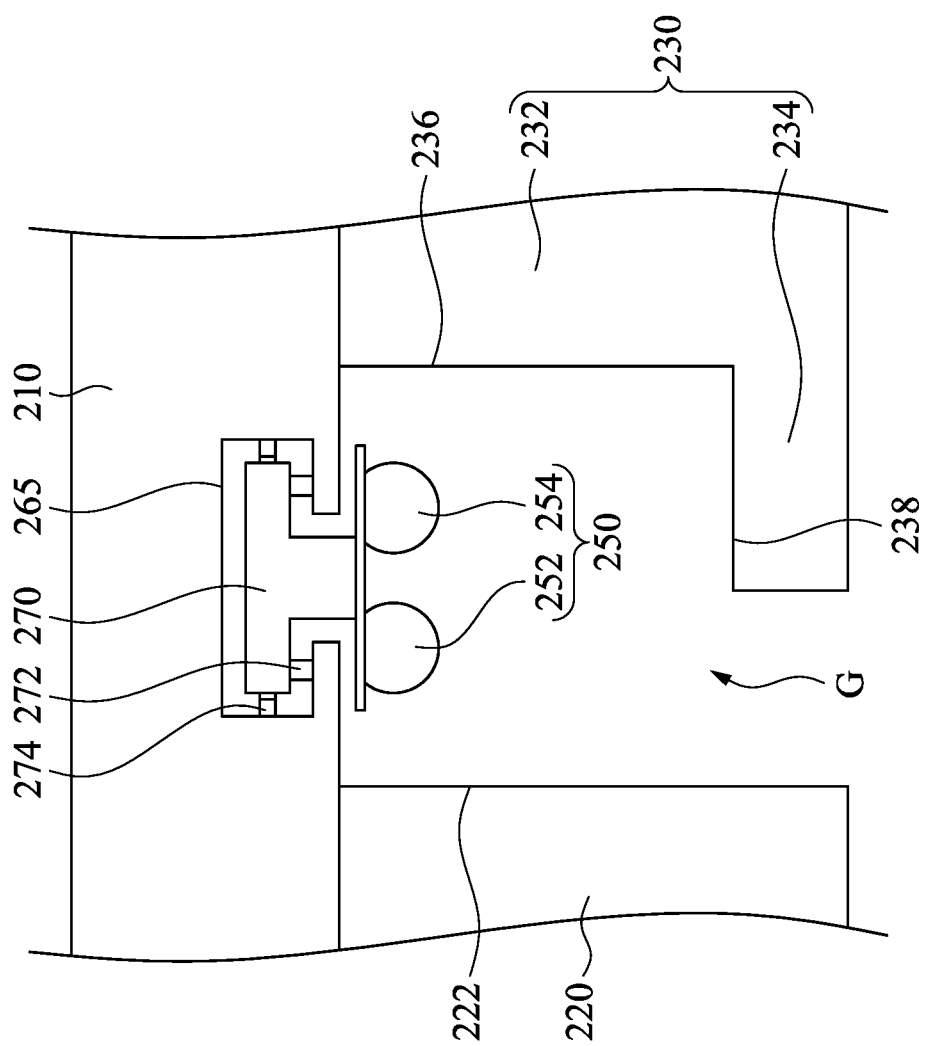
FIG. 5 is a cross-sectional view taken along line 5 of FIG. 4.

Reference is made to FIGS. 4 and 5. FIG. 5 is a cross-sectional view taken along line 5 of FIG. 4. The polish head 200 further includes a rail 265 in the carrier head 210. The rail 265 is a circular rail and is disposed in a peripheral region of the polish head 200 and above the gap G between the inner retaining ring 220 and the outer retaining ring 230. The rail 265 extends substantially along the gap G. The image capturing device 250 is coupled to the rail 265 and is movable along the rail 265 and thus movable along the gap G. In some embodiments, the image capturing device 250 includes a light source 252 and a light receiver 254. The light source 252 and the light receiver 254 are disposed on a bottom surface of a bracket 270 and face the gap G. The bracket 270 is held by the rail 265. In some embodiments, a plurality of bearing rollers 272 are disposed between a bottom portion of the rail 265 and the bracket 270. The bracket 270 and the image capturing device 250 are supported by the bearing roller 272. The bracket 270 is connected to and driven by a motor, such that the bracket 270 and the image capturing device 250 can be moved along the rail 265. In some embodiments, a plurality of guiding rollers 274 are disposed between the bracket 270 and sidewalls of the rail 265, such that the movement of the bracket 270 can be more stable.

In some other embodiments, as shown in FIG. 6, a plurality of image capturing device 250 are arranged along the gap G between the inner retaining ring 220 and the outer retaining ring 230 of the polish head 200. Each of the image capturing devices 250 is not movable and is configured to capture images at its local location. In some embodiments, the image capturing device 250 are arranged at regular intervals.

Figure 7:
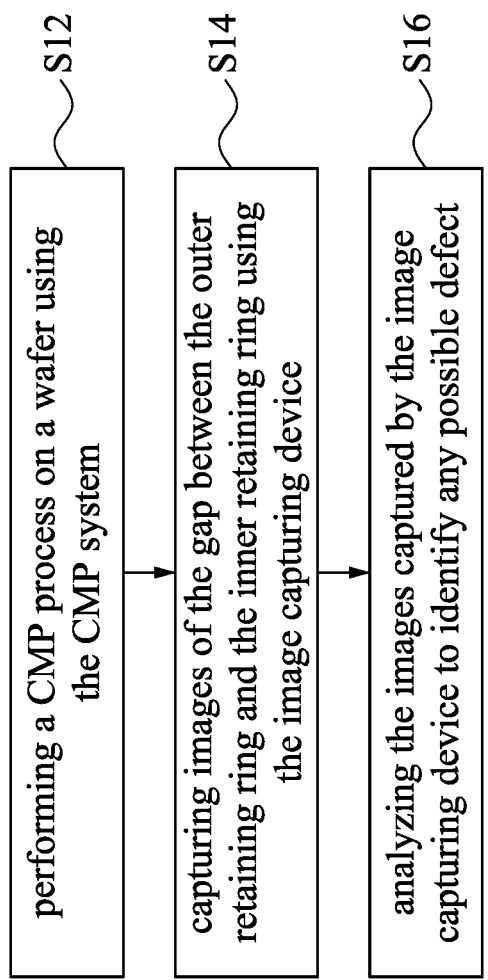
FIG. 7 is a flowchart of a method for operating the CMP system of FIG. 1.

Reference is now made to FIGS. 1, 2, and FIG. 7. FIG. 7 is a flowchart of a method for operating the CMP system 100 of FIG. 1. In step S12, a CMP process is performed on a wafer 10 using the CMP system 100. During the CMP process, slurry 20 is supplied to the polish pad 120. For example, the slurry 20 is supplied by the slurry dispenser 150, and at least one of the nozzles 154 drops the slurry 20 on the polish pad 120. The platen 110 is driven by a motor to rotate the polish pad 120 about a rotation axis. The wafer 10 is secured upside-down in the polish head 200, surrounded by the inner retaining ring 220, and under the membrane 240. The polish head 200 is lowered to the polish pad 120 and presses the wafer 10 against the polish pad 120. In some embodiments, after the polish head 200 is lowered to the polish pad 120, the membrane 240 of the polish pad 120 is pressurized to push the wafer 10 towards the polish pad 120.

The polish head 200 is driven by a drive shaft to rotate, and to oscillate. In some embodiments, the oscillation path of the polish head 200 is along a radial direction of the polish pad 120. As the polish head 200 rotates and sweeps across the polish pad 120, the outer retaining ring 230 retains the inner retaining ring 220 in a horizontal position, and the inner retaining ring 220 in turn retains the wafer 10 in a horizontal position. The slurry 20 flows through the indented slots 260 (see FIG. 4) of the outer retaining ring 230 and the indented slots 262 (see FIG. 4) of the inner retaining ring 220 to the wafer 10.

The conditioner 140 is pressed against the polish pad 120 and made to rotate and oscillate, for maintaining an even surface on the polish pad 120.

In step S14, images of the gap between the outer retaining ring 230 and the inner retaining ring 220 are captured using the image capturing device 250. In some embodiments, the image capturing device 250 is moved along the gap between the inner retaining ring 220 and the outer retaining ring 230 after single CMP process of the wafer 10 is completed, and then captures images of the gap. In some embodiments, the image capturing device 250 captures images of the gap between the inner retaining ring 220 and the outer retaining ring 230 at regular intervals as it moves along the gap.

In some other embodiments, as shown in FIG. 6, a plurality of image capturing device 250 are arranged inside the gap between the inner retaining ring 220 and the outer retaining ring 230 of the polish head 200. The image capturing devices 250 are not movable and in step S14, the image capturing devices 250 capture images at their local location.

Reference is made to FIG. 5. In some embodiments, during each image capturing operation, the light source 252 of the image capturing device 250 is turned on to lighten the gap G between the inner retaining ring 220 and the outer retaining ring 230, and the light receiver 254 of the image capturing device 250 captures the light reflected from the inner sidewall 236 of the wall portion 232 of the outer retaining ring 230, the outer sidewall 222 of the inner retaining ring 220, and/or the top surface 238 of the ledge portion 234. In some embodiments, the light source 252 is continuously turned on during plural capturing operations; in some other embodiments, the light source 252 is a pulsed light source and is turned on during each capturing operation and is turned off after each capturing operation.

Reference is made to FIGS. 1 and 7. In step S16, the images captured by the image capturing device 250 are analyzed to identify any possible defect. The possible defect may include the contaminant residue in the gap between the inner retaining ring 220 and the outer retaining ring 230 and/or on the top surface of the ledge portion of the outer retaining ring 230, and/or wear on the outer retaining ring 230 and/or the inner retaining ring 220. If any defect is detected, an alarm is reported and a cleaning process and/or preventive maintenance are/is performed in response to the alarm to remove the defect.

In some embodiments, the steps S14 and S16 may be taken after polishing each wafer, or at the end of the entire chemical mechanical polishing process. In other words, steps S14 and S16 may be taken at the end of each cycle of step S12. In some other embodiments of the disclosure, steps S14 and S16 can be taken after a series of cycles of steps 12 is repeated multiple times.

Some embodiments of the present disclosure provide a polish head having an image capturing device disposed between the inner retaining ring and the outer retaining ring. The image capturing device is configured to capture images of the gap between the inner retaining ring and the outer retaining ring. The captured images can be analyzed to identify any possible defect.

According to some embodiments of the disclosure, a polish head of a chemical mechanical polishing system. The polish head includes a carrier head, a membrane mounted to the carrier head, an inner retaining ring mounted to the carrier head and surrounding the membrane, an outer retaining ring mounted to the carrier head and surrounding the inner retaining ring, and an image capturing device. The outer retaining ring is spaced apart from the inner retaining ring. The image capturing device is mounted to the carrier head and between the inner retaining ring and the outer retaining ring.

According to some embodiments of the disclosure, a method includes performing, using a chemical mechanical polishing (CMP) system, a CMP process on a wafer; and after performing the CMP process, capturing an image of a gap between an inner retaining ring and an outer retaining ring of a polish head of the CMP system.

According to some embodiments of the disclosure, a method includes picking up a wafer using a polish head having an inner retaining ring and an outer retaining ring, in which the outer retaining ring has a wall portion and a ledge portion extending from the wall portion toward the inner retaining ring. The wafer is polished. After polishing the wafer, an image of a top surface of the ledge portion of the outer retaining ring is captured.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing, using a chemical mechanical polishing (CMP) system, a CMP process on a wafer;
after performing the CMP process, capturing an image of a gap between an inner retaining ring and an outer retaining ring of a polish head of the CMP system using an image capture device, wherein the image capturing device is moved along a circular rail between the inner retaining ring and the outer retaining ring during capturing the image; and
observing a surface roughness of an inner sidewall of the inner retaining ring and a surface roughness of an inner sidewall of the outer retaining ring based on the captured image.

2. The method of claim 1, wherein the outer retaining ring has a wall portion and a ledge portion extending from the wall portion toward the inner retaining ring;
further comprising:
analyzing the captured image to determine whether a width of the ledge portion of the outer retaining ring is less than a predetermined value; and
replacing the outer retaining ring when the width of the ledge portion of the outer retaining ring is determined to be less than the predetermined value.

3. The method of claim 1, further comprising:
analyzing the captured image to determine whether a contaminant residue inside the gap exceeds a predetermined threshold; and
removing the contaminant residue from the gap when the contaminant residue inside the gap is determined to exceed the predetermined threshold.

4. The method of claim 1, wherein the inner retaining ring has a slot in a bottom surface of the inner retaining ring, the outer retaining ring has a slot in a bottom surface of the outer retaining ring, and the gap is in fluid communication with the slot of the inner retaining ring and the slot of the outer retaining ring at a junction; and
wherein the image is captured such that a portion of the gap adjacent to the junction is in the captured image.

5. The method of claim 1, wherein the outer retaining ring has a wall portion and a ledge portion extending from the wall portion toward the inner retaining ring.

6. The method of claim 5, wherein the image includes a top surface of the ledge portion of the outer retaining ring.

7. The method of claim 6, wherein the image capturing device is above the top surface of the ledge portion of the outer retaining ring.

8. A method, comprising:
picking up a wafer using a polish head having an inner retaining ring and an outer retaining ring, wherein the outer retaining ring has a wall portion and a ledge portion extending from the wall portion toward the inner retaining ring;

polishing the wafer; and after polishing the wafer, capturing an image of a top surface of the ledge portion of the outer retaining ring using an image capturing device above the top surface of the ledge portion of the outer retaining ring, wherein the image capturing device is moved along a circular rail between the inner retaining ring and the outer retaining ring during capturing the image.

9. The method of claim 8, further comprising:

processing the captured image to calculate an area of the top surface of the ledge portion of the outer retaining ring; and replacing the outer retaining ring when the calculated area of the top surface of the ledge portion of the outer retaining ring is less than a predetermined value.

10. A method, comprising:

pressing a wafer against a polish pad by using a polish head, the polish head comprising an inner retaining ring surrounding the wafer, and an outer retaining ring surrounding the inner retaining ring;

dispensing a slurry onto the polish pad;

rotating the wafer relative to the polish pad by using the polish head; and capturing one or more images by using an image capturing device disposed in a gap between the inner retaining ring and the outer retaining ring, wherein the image capturing device is moved along a circular rail between the inner retaining ring and the outer retaining ring during capturing of the one or more images.

11. The method of claim 10, wherein the image capturing device has a field of view covering the gap between the inner retaining ring and the outer retaining ring.

12. The method of claim 10, wherein the image capturing device has a field of view covering a ledge portion of the outer retaining ring.

13. The method of claim 12, wherein the ledge portion of the outer retaining ring horizontally extends from a vertical wall of the outer retaining ring towards the inner retaining ring.

14. The method of claim 10, further comprising:

revolving the image capturing device around the inner retaining ring.

15. The method of claim 14, wherein the one or more images are captured when the image capturing device are revolved to different positions.

16. The method of claim 10, wherein the one or more images are captured when the image capturing device are moved along the circular rail to different positions.

17. The method of claim 10, further comprising:

determining, based on the one or more images captured by the image capturing device, whether an area of a top surface of a ledge of the outer retaining ring satisfies a predetermined condition; and in response to the determination determines that the area of the top surface of the ledge of the outer retaining ring unsatisfies the predetermined condition, replacing the outer retaining ring.

18. The method of claim 10, wherein the image capturing device comprises a light source and a light receiver.

19. The method of claim 18, wherein the light source and the light receiver are disposed on a bottom surface of a bracket in the polish head.

20. The method of claim 10, wherein the outer retaining ring has a wall portion and a ledge portion extending from the wall portion toward the inner retaining ring, and the image capturing device is above the ledge portion of the outer retaining ring.

* * * * *